(12) United States Patent
Mori et al.

(10) Patent No.: US 6,207,527 B1
(45) Date of Patent: Mar. 27, 2001

(54) METHOD OF MANUFACTURING SEMICONDUCTOR DEVICE

(75) Inventors: Kiyoshi Mori; Junichi Tsuchimoto; Yutaka Inaba; Tamotsu Ogata, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/335,690

(22) Filed: Jun. 18, 1999

(30) Foreign Application Priority Data

Jan. 22, 1999 (JP) ................................................ 11-014163

(51) Int. Cl.$^7$ ................................................... H01L 21/20
(52) U.S. Cl. ........................... 438/398; 438/253; 438/255; 438/396
(58) Field of Search ..................... 438/255, 398, 438/396, 253

(56) References Cited

U.S. PATENT DOCUMENTS

| | | | |
|---|---|---|---|
| 5,444,013 | * 8/1995 | Akram et al. | 438/398 |
| 5,597,756 | * 1/1997 | Fazan et al. | 438/398 |
| 5,759,262 | * 6/1998 | Weimer et al. | 438/398 |
| 5,798,290 | 8/1998 | Mori et al. | 438/398 |
| 5,882,979 | * 3/1999 | Ping et al. | 438/398 |
| 5,963,804 | * 10/1999 | Figura et al. | 438/255 |
| 6,004,858 | * 12/1999 | Shim et al. | 438/398 |

FOREIGN PATENT DOCUMENTS 6-314774  11/1994  (JP).
9-129848   5/1997  (JP).

OTHER PUBLICATIONS

"Growth Mechanism of Polycrystalline Si Films with Hemisperical Grains", T. Tatsumi, et al., Appl. Phys. vol. 61, No. 11, 1992, ppl 1147–1151 (with English commentary).

* cited by examiner

Primary Examiner—Wael Fahmy
Assistant Examiner—Toniae M. Thomas
(74) Attorney, Agent, or Firm—McDermott, Will & Emery

(57) ABSTRACT

A method of manufacturing a semiconductor device including a capacitor having an increased capacity with improved yield is provided. Ions are implanted at an incidence angle of 0° in a dose of $8 \times 10^{15}$ atom/cm$^2$, at an energy of 20 keV, using a heavy current device and an amorphous silicon film having an upper surface flattened is formed. Only the flattened amorphous silicon film formed on the upper surface of an interlayer oxide film is etched back to form a storage electrode.

5 Claims, 13 Drawing Sheets

METHOD OF MANUFACTURING SEMICONDUCTOR DEVICE

BACKGROUND OF THE INVENTION

1. Field of the Invention

The present invention relates generally to methods of manufacturing semiconductor devices, and more particularly, to a method of manufacturing a semiconductor device having a capacitor largely extending in the direction orthogonal to the semiconductor substrate.

2. Description of the Background Art

Conventional capacitors have their area reduced in the direction parallel to the main surface of the semiconductor substrate and increased in the direction orthogonal to the main surface of the semiconductor substrate in order to secure sufficient capacitor capacity in a limited two-dimensional region. Therefore, in a capacitor for a 64 mbit DRAM (Dynamic Random Access Memory) and on, the simple large thickness type structure, fin-type structure, cylindrical structure or the like is employed. In order to enlarge the opposing area between the electrodes of a capacitor in the same structure, a storage electrode, the lower electrode of a capacitor is chemically or thermally treated in order to increase the surface area of the lower electrode of the capacitor. According to a known method of increasing the surface area of the lower electrode of a capacitor, for example, silicon crystals as described in Appl. Phys. Vol. 61, No. 11, p.1147 (1992) are allowed to grow on the surface of the storage electrode and irregularities are formed on the surface.

A conventional method of manufacturing a semiconductor device having a capacitor will be described in conjunction with FIGS. 17 to 26. In this method, a gate electrode 103 is formed on a semiconductor substrate 101 with a gate oxide film 102 therebetween. Then, source/drain regions 104 are formed on both sides of gate electrode 103 as shown in FIG. 17. An interlayer oxide film 105 is formed to cover gate oxide film 102 and gate electrode 103. Then, using a resist film 106 patterned on interlayer oxide film 105 as a mask, a contact hole 105a connecting source/drain region 104 is formed through interlayer oxide film 105 as shown in FIG. 18. Subsequently, after removal of the resist film, as shown in FIG. 19, contact hole 105a is filled with a contact plug 107 including polycrystalline silicon containing an impurity. Then, an upper interlayer oxide film 108 is formed on interlayer oxide film 105.

Then, as shown in FIG. 20, using a resist film 109 patterned on upper interlayer oxide film 108 as a mask, a hole 108a is formed on upper interlayer oxide film 108 by dry etching to expose an upper surface of contact plug 107. As shown in FIG. 21, a polycrystalline silicon film 110 including an impurity to be a storage electrode is formed to have a prescribed thickness along the side surface 108a and bottom surface 108c of first hole 108a and the upper surface 108b of interlayer oxide film 108. Irregularities are formed on the surface of polycrystalline silicon film 110 containing an impurity and as shown in FIG. 22, a polycrystalline silicon film 111 having irregularities is formed. A resist film 112 is formed to fill the side and bottom surfaces 111a and 111c of a second hole formed by polycrystalline silicon film 111 having the irregularities, and the state as shown in FIG. 23 is attained.

Only polycrystalline silicon film 111 with irregularities formed on the upper surface 108b of interlayer oxide film 108 is removed by dry etching, and as shown in FIG. 24, a storage electrode 115 is formed. As shown in FIG. 25, resist film 112 is removed and a capacitor dielectric film 116 is formed to cover the surface of storage electrode 115 and the upper surface 108b of interlayer oxide film 108. A cell plate electrode 117 is formed to cover the side surface 116a and the bottom surface of a third hole formed by capacitor dielectric film 116 and the upper surface 116b of the capacitor dielectric film, and the semiconductor device having a DRAM with a capacitor electrode as shown in FIG. 26 is completed.

However, in the step of etching back polycrystalline silicon film 111 with irregularities formed on the upper surface 108b of interlayer oxide film 108 in the state shown in FIG. 23, if a device which ends the etching process at the time the upper surface 108b of interlayer oxide film 108 is exposed is used, as shown in FIG. 24, the irregularities on the upper surface 111b of polycrystalline silicon film 111 causes etching residue 150 having a corresponding irregular shape to remain. Therefore, as shown in FIG. 26, capacitor dielectric film 116 and cell plate electrode 117 are sequentially formed on etching residue 150. Etching residue 150 adversely affects the state of a stack of layers formed on interlayer insulating film 8 in succeeding steps. Etching residue 150 having conductivity could short-circuit another conductive layer and storage electrode 115.

SUMMARY OF THE INVENTION

The present invention is directed to a solution to the above-described problems, and it is an object of the present invention is to provide a method of manufacturing a semiconductor device including a capacitor, according to which the conductive etching residue is restrained from adversely affecting the state a stack of layers to be formed on the interlayer insulating film in succeeding steps and short-circuiting another conductive layer and a storage electrode, so that the yield can be improved.

The method of manufacturing a semiconductor device includes the steps of: forming an interlayer insulating film on a semiconductor substrate; forming a first hole through the interlayer insulating film; forming a first layer including a semiconductor layer having a prescribed thickness so that a second hole is formed on side and bottom surfaces of the first hole and an upper surface of the interlayer insulating film; forming irregularities on a surface of the first layer; implanting ions into the upper surface of the first layer formed at least on the upper surface of the interlayer insulating film; removing only the first layer formed on the upper surface of the interlayer insulating film, thereby forming a first conductive layer; forming a dielectric film having a prescribed thickness to cover at least the surface of the first conductive layer and have a third hole on side and bottom surfaces of the second hole; and forming a second conductive layer to cover at least a surface of the dielectric film.

By this manufacturing method including the step of implanting ions into the surface of the first layer, the implanted ions can eliminate the raised portion of the irregularities formed on the surface of the first layer and fill the recessed portion. As a result, the irregularities formed on the surface of the first layer can be formed approximately parallel to the upper surface of the interlayer insulating film, and therefore, the surface of the first layer can be etched back approximately parallel to the upper surface of the interlayer insulating film. The irregularities formed on the surface of the first layer can be etched back without being left as etching residue on the upper surface of the interlayer insulating film. Therefore, the adverse effect on layers to be formed in succeeding steps and short-circuit between another conductive layer and the storage electrode caused by the etching residue of the first layer becoming conductive because of ion implantation can be restrained. Thus, if the first layer has irregularities on the surface for securing a larger area for the storage electrode of the capacitor, the yield of semiconductor devices having such a capacitor can be improved.

If the first layer is a semiconductor layer not provided with an impurity, an impurity must be implanted to allow the layer to serve as a storage electrode, and therefore, the step of implanting ions to eliminate the irregularities on the first layer on the interlayer insulating film as well as the step of implanting ions to allow the storage electrode to have conductivity are performed so that the above large capacity capacitor can be formed without further increasing the number of steps.

In the above method of manufacturing a semiconductor device, the ions are preferably implanted vertically to the upper surface of the interlayer insulating film.

By this manufacturing method, the irregularities on the surface of the first layer approximately parallel to a side of the first hole formed approximately vertical to the upper surface of the interlayer insulating film are less likely to be flattened by the ion-implantation, and therefore the capacity of the capacitor can be increased.

In the manufacturing method according to the present invention, preferably, the dose of ions in the implantation step is not less than $8 \times 10^{15}$ atom/cm$^2$, and the ion implantation energy is in the range from 10 keV to 100 keV.

By flattening the irregularities at the energy and dose as described above, the irregularities can be flattened to such an extent that there will be no adverse effect on succeeding steps. More specifically, the irregularities on the surface of the first layer can be surely flattened and ions can be prevented from penetrating through the first layer.

In the above manufacturing method, the ion species may be silicon.

The use of such ion species reduces adverse effect on the first layer when the first layer includes polycrystalline or amorphous silicon.

In the above manufacturing method, the ion species may be phosphorus or arsenic in the step of ion-implantation.

The use of such an n-type ion species reduces adverse effect on the first layer when the first layer is formed as an n-type layer.

In the above manufacturing method, the first layer may be formed by an amorphous silicon layer.

By this manufacturing method, in the step of forming irregularities on the surface of the first layer to be the storage electrode of a capacitor, if the first layer is an amorphous silicon layer, silicon atoms to allow silicon crystal to grow in the vicinity of the surface of the first layer can be supplied from the first layer whose silicon is not yet crystallized. Therefore, in a method of forming a thin silicon layer on the surface of the first layer followed by a heat treatment, thereby allowing silicon crystal to grow and forming irregularities on the surface of the first layer, the irregularities having a larger surface area are formed on the first layer. As a result, the surface area of the storage electrode can be increased, and the charge storing capacity of the capacitor improves.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be now described in conjunction with the accompanying drawings.

First Embodiment

Figure 1:
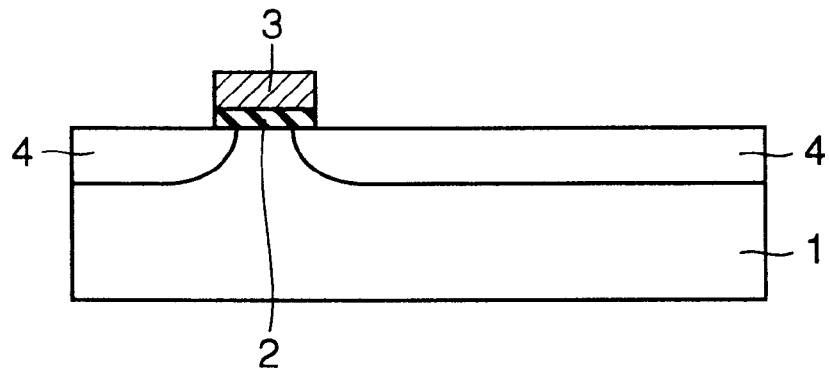
FIG. 1 is a cross sectional view showing a state immediately after source/drain region are formed on both sides of a gate electrode in a method of manufacturing a semiconductor device according to a first embodiment of the present invention.
Figure 2:
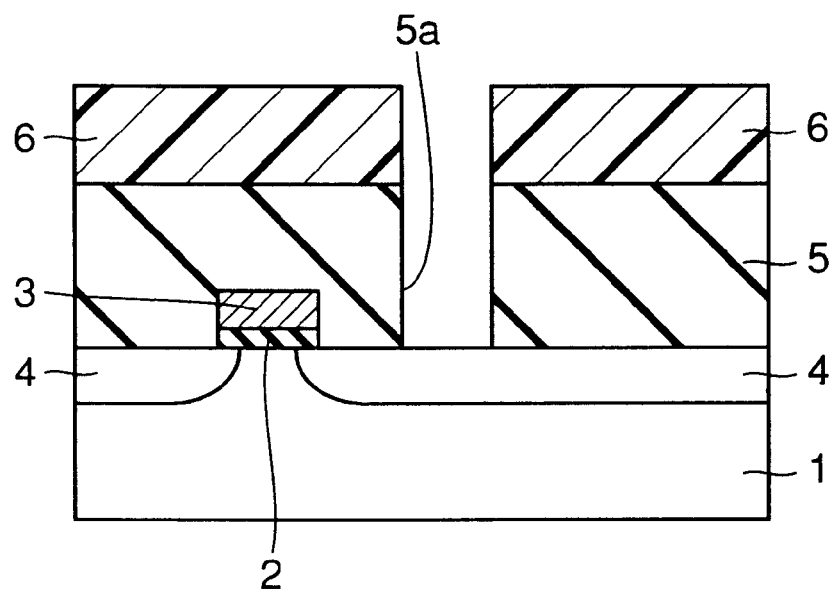
FIG. 2 is a cross sectional view showing a state immediately after a contact hole penetrating through an interlayer oxide film which covers the gate electrode and connecting a source/drain region in the method according to the first embodiment.
Figure 3:
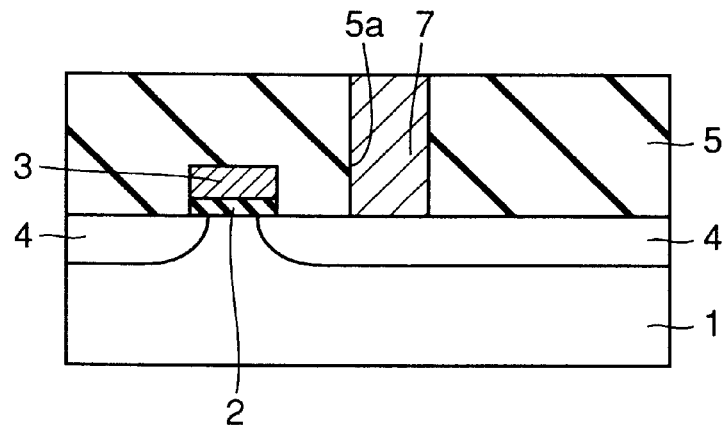
FIG. 3 is a cross sectional view showing a state immediately after a contact plug fills the contact hole connecting with the source/drain region in the method according to the first embodiment.

A method of manufacturing a semiconductor device according to a first embodiment of the present invention will be now described in conjunction with FIGS. 1 to 10. In the method according to this method, a gate electrode 3 is formed on a semiconductor substrate 1 with a gate oxide film 2 therebetween. Source/drain regions 4 are formed on both sides of gate electrode 3 as shown in FIG. 1. Then, an interlayer oxide film 5 as thick as 4000 Å is formed by CVD to cover gate oxide film 2 and gate electrode 3. Then, a resist film 6 in a prescribed pattern is formed by photolithography, and using resist film 6 as a mask, dry etching is performed to form a contact hole 5a penetrating through interlayer oxide film 5 and connecting with a source/drain region 4 is formed as shown in FIG. 2. Subsequently, as shown in FIG. 3, contact hole 5a is filled with a contact plug 7 of polycrystalline silicon containing an impurity and having a thickness of 4000 Å. Then, an upper interlayer oxide film 8 is formed on interlayer oxide film 5.

Figure 4:
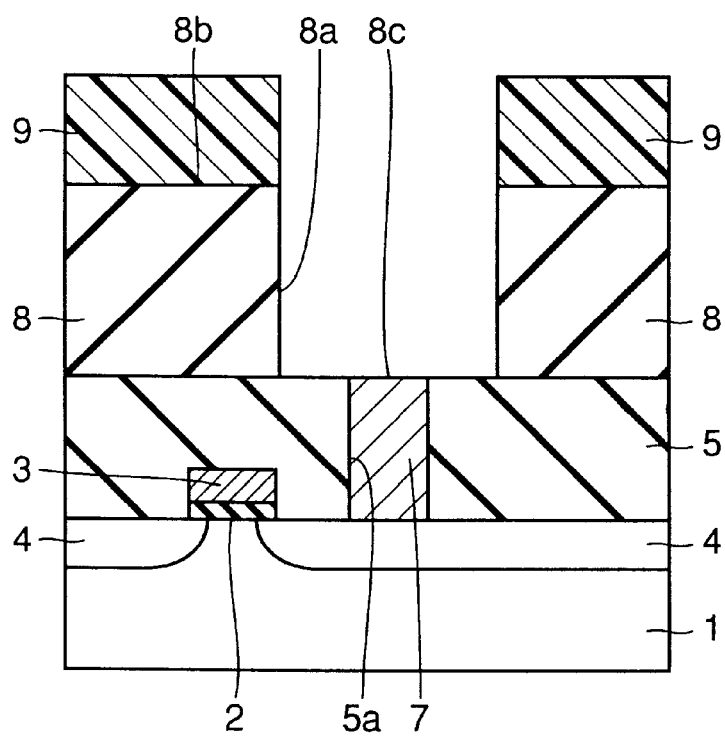
FIG. 4 is a cross sectional view showing a state immediately after a contact hole to connect with the contact plug is formed at an upper interlayer oxide film in the method according to the first embodiment.
Figure 5:
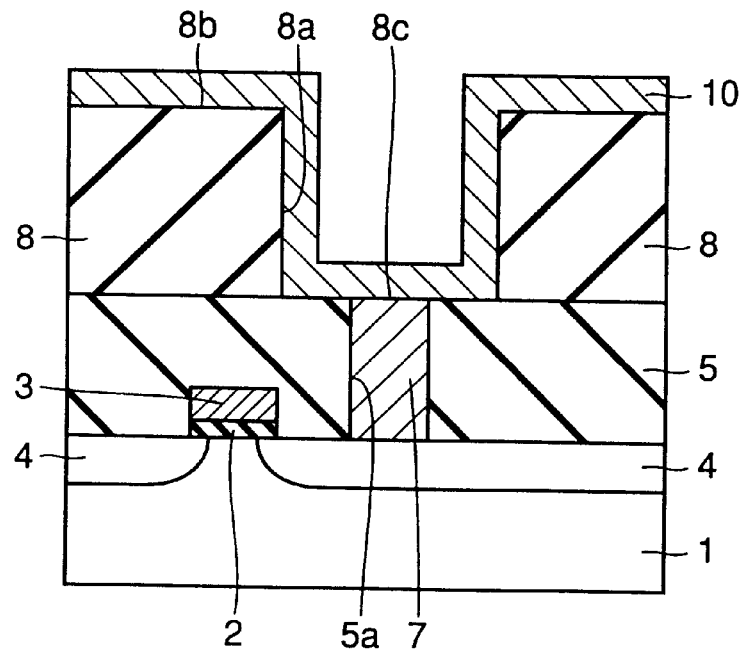
FIG. 5 is a cross sectional view showing a state immediately after an amorphous silicon film containing an impurity to be a storage electrode to cover a surface of the upper interlayer oxide film and the bottom surface of the hole in the method according to the first embodiment.
Figure 6:
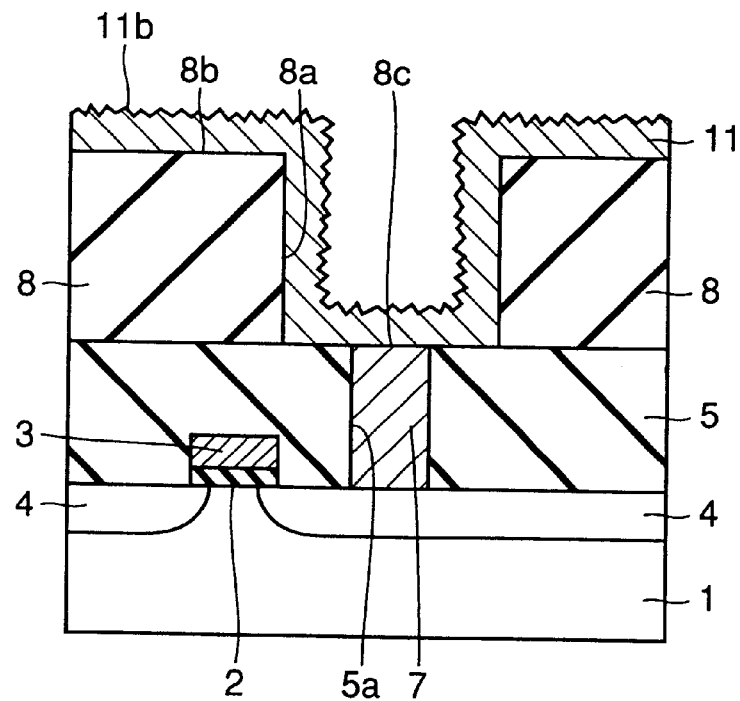
FIG. 6 is a cross sectional view showing a state immediately after irregularities are formed by heat treatment on the surface of the amorphous silicon film containing an impurity to be the storage electrode in the method according to the first embodiment.

As shown in FIG. 4, using a resist film 9 patterned on upper interlayer oxide film 8 as a mask, a first hole having a side wall 8a is formed by dry-etching on upper interlayer oxide film 8 as thick as 8000 Å, and a surface of contact plug 7 is exposed. As shown in FIG. 5, using a tube type reduced pressure CVD apparatus, an amorphous silicon film 10 as thick as 500 Å to be a storage electrode and containing an impurity of a concentration of $2 \times 10^{20}$ atom/cm$^3$ is formed at a temperature in the range from 515° C. to 535° C. and in a deposition pressure of 0.45 Torr along the shape of the side and bottom surfaces 8a and 8c of the first hole and the upper surface 8b of interlayer oxide film 8. Then, amorphous silicon film 10 is heat-treated at a temperature of 700° C. for 5 minutes to form irregularities on the surface of amorphous silicon film 10 containing the impurity as shown in FIG. 6, and an amorphous silicon film 11 having irregularities is formed. Then, a resist film 12 is formed to fill the side and bottom surfaces 11a and 11c of a second hole formed by amorphous silicon film 11 having the irregularities.

Figure 7:
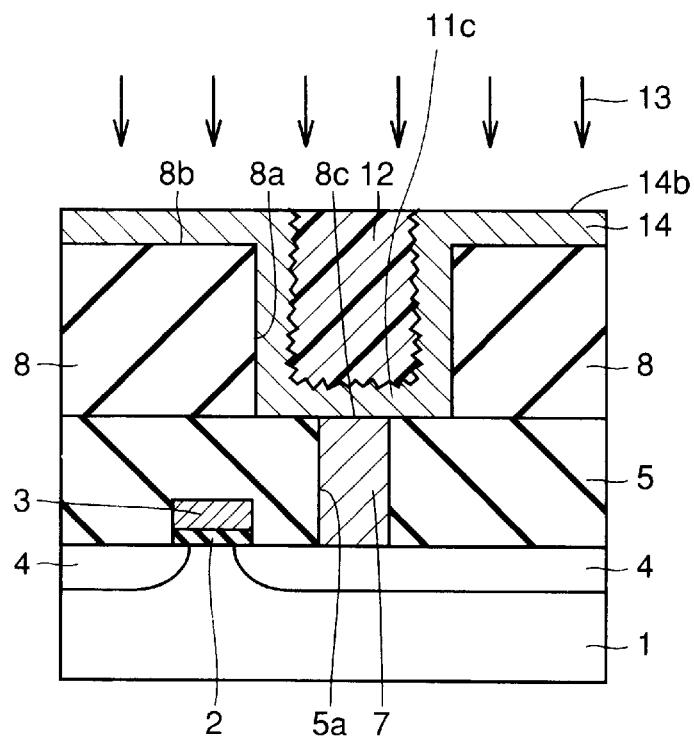
FIG. 7 is a cross sectional view showing a state immediately after the amorphous silicon film having the irregularities formed on the upper surface of the interlayer oxide film is flattened by ion-implantation in the method according to the first embodiment.
Figure 8:
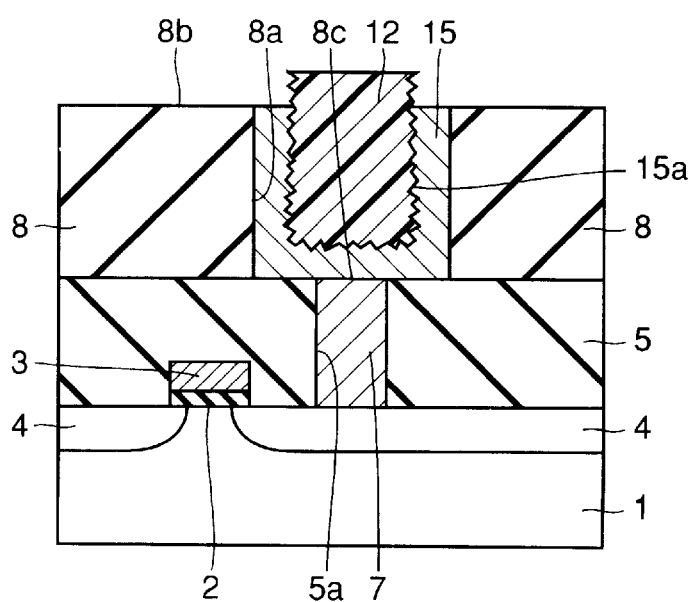
FIG. 8 is a cross sectional view showing a state immediately after the amorphous silicon film having the irregularities formed on the upper surface of the interlayer oxide film is removed by etch back in the method according to the first embodiment.

Subsequently, as shown in FIG. 7, ions are implanted, as shown by arrows 13, using a heavy current device, with a dose of $8 \times 10^{15}$ atom/cm$^2$, at an energy of 20 keV, and at an incidence angle of 0° onto the upper surface 11b of amorphous silicon film 11 having irregularities formed on the upper surface 8b of interlayer oxide film 8, and thus an amorphous silicon film 14 having its upper surface 14b flattened is formed. Then, only the flattened amorphous silicon film 14 formed on the upper surface 8b of interlayer oxide film 8 is removed, and a storage electrode 15 is formed as shown in FIG. 8.

Figure 9:
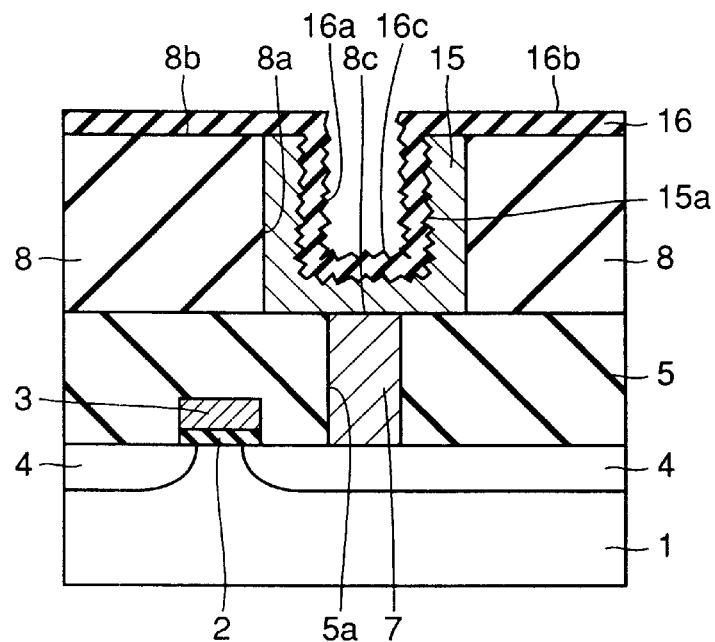
FIG. 9 is a cross sectional view showing a state immediately after a capacitor dielectric film is formed to fill the hole in the method according to the first embodiment.
Figure 10:
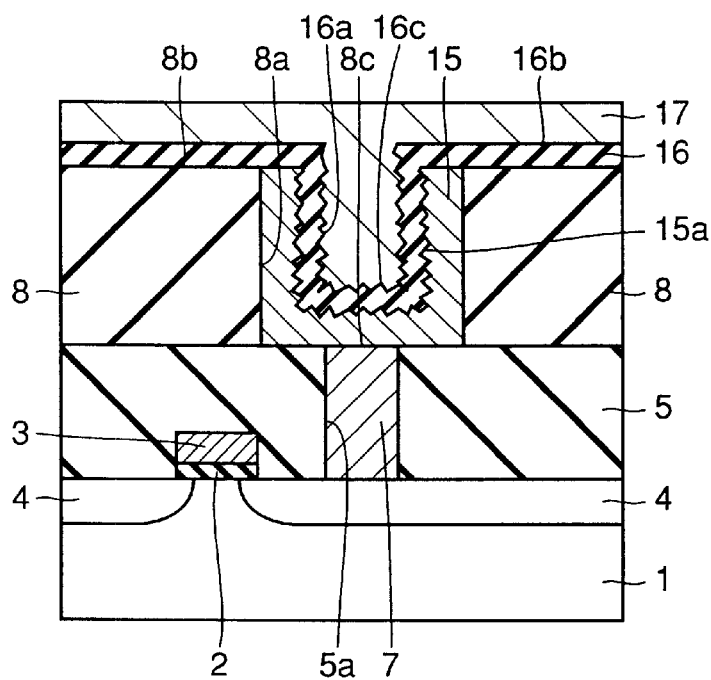
FIG. 10 is a cross sectional view showing a state immediately after a cell plate is formed to cover the capacitor dielectric film in the method according to the first embodiment.

Subsequently, as shown in FIG. 9, resist film 12 is removed and a capacitor dielectric film 16 is formed to cover the surface of storage electrode 15 and the upper surface 8b of interlayer oxide film 8. Then, as shown in FIG. 10, a cell plate electrode 17 is formed to cover the side and bottom surfaces 16a and 16c of a third hole formed by capacitor dielectric film 16 and the upper surface 16b of capacitor dielectric film 16.

Since the manufacturing method includes the step of implanting ions as denoted by arrow 13 in FIG. 7 onto amorphous silicon film 11 with irregularities, the ions eliminate the raised portion or fill the recessed portion of the irregularities formed on the upper surface 11b of amorphous silicon film 11. Therefore, the upper surface 14b of the flattened amorphous silicon film 14 can be formed approximately parallel to the upper surface 8b of interlayer oxide film 8. Thus, in the step of etching back and removing flattened amorphous silicon film 14 formed on the upper surface 8b of interlayer oxide film 8, the upper surface 14b of flattened amorphous silicon film 14 formed on the upper surface 8b of interlayer insulating film 8 can be etched back constantly approximately parallel to the upper surface 8b of interlayer oxide film 8.

Thus, the etch back can be achieved without leaving the irregularities on the upper surface 11b of amorphous silicon film 11 as etching residue on the upper surface 8b of interlayer oxide film 8. As a result, adverse effect on layers to be formed on interlayer oxide film 8 in succeeding steps can be restrained. Short circuit between another conductive layer and the capacitor by the etching residue of the amorphous silicon film having conductivity can be restrained. Thus, if such amorphous silicon film 11 having irregularities is formed in order to increase the area of the storage electrode of a capacitor, the yield of semiconductor devices having the capacitor can be improved.

In the step of implanting ions as denoted by arrow 13 in FIG. 7, the ions are implanted vertically to the upper surface 8b of interlayer oxide film 8, the irregular surface form of amorphous silicon film 11 having the irregularities approximately parallel to the side surface 8a of a first hole formed approximately vertically to the upper surface 8b of interlayer oxide film 8 is less likely to be flattened by the ion implantation as denoted by arrow 13, so that the capacity of the capacitor can be maintained at a prescribed level.

In the step of implanting ions as denoted by arrow 13, if the dose of the ions is not less than $8 \times 10^{15}$ atom/cm$^2$, and the implantation energy is in the range from 10 keV to 100 keV, the irregularities can be flattened to such an extent that succeeding steps will not be adversely affected. More specifically, the irregularities of the surface of amorphous silicon film 11 can be surely flattened and ions can be prevented from penetrating through amorphous silicon film 11.

In the step of implanting ions as denoted by arrow 13, silicon is used as an ion species, the adverse effect on amorphous silicon film 11 is small. Furthermore, in the step of implanting ions as denoted by arrow 13, if the ion species is n-type, phosphorus or arsenic, and if the above-described manufacturing method is applied to an N-channel MOS (Metal Oxide Semiconductor) transistor, the transistor is scarcely adversely affected.

In addition, amorphous silicon film 10 containing an impurity is not yet crystallized. Therefore, in the step of forming irregularities on the surface of amorphous silicon film 10 containing an impurity to be the storage electrode 15 of a capacitor, silicon atoms for growing crystal in the vicinity of the surface of amorphous silicon film 10 containing an impurity can be supplied not only from silicon atoms being added but also from amorphous silicon film 10 containing an impurity. Therefore, when a thin silicon film is formed on the surface of amorphous silicon film 10 containing an impurity followed by heat-treatment to allow silicon to grow and irregularities are formed on the surface of amorphous silicon film 10, larger irregularities are formed on the surface of amorphous silicon film 10 containing an impurity. As a result, the surface area of storage electrode 15 is increased, which improves the charge storing capability of the capacitor.

The bottom surface 11c of the second hole in amorphous silicon film 10 having irregularities is protected by resist 12 in the step of implanting ions as denoted by arrow 13. Therefore, the irregularities on the bottom surface 11c of the second hole in amorphous silicon film 10 containing an impurity will not be flattened by the ion-implantation as denoted by arrow 13. Thus, if, in a capacitor, the bottom surface 16c of the third hole is larger than the side surface 16a, the surface irregularities of storage electrode 15 are more likely to be flattened and a desired capacitor capacity is more often obtained.

Second Embodiment

Figure 11:
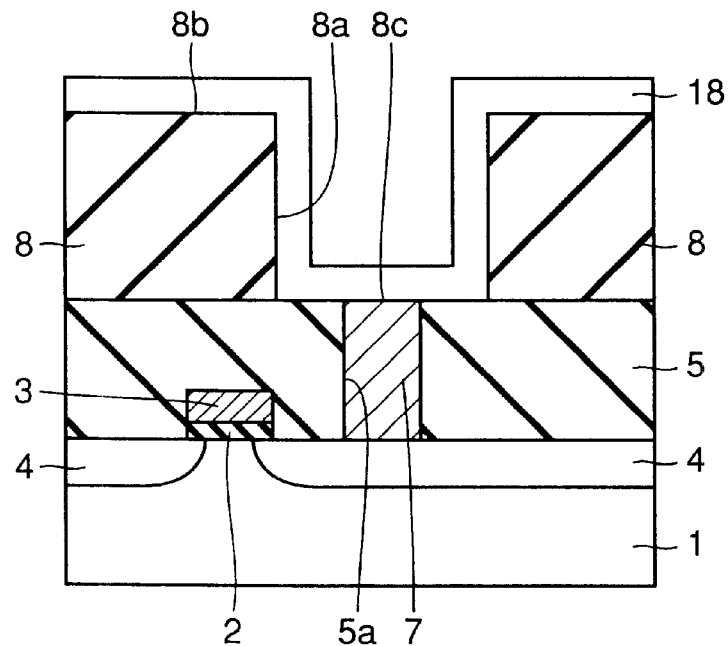
FIG. 11 is a cross sectional view showing a state immediately after an amorphous silicon film without an impurity to be a storage electrode to connect with a contact plug is formed in a method of manufacturing a semiconductor device according to a second embodiment of the present invention.
Figure 12:
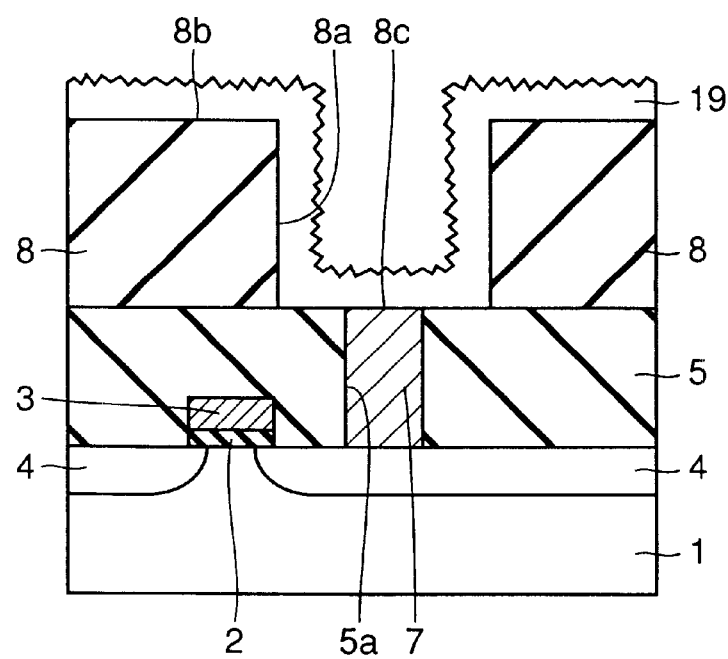
FIG. 12 is a cross sectional view showing a state immediately after irregularities are formed on the surface of the amorphous silicon film without an impurity to be a storage electrode in the method according to the second embodiment.

A method of manufacturing a semiconductor device according to a second embodiment of the present invention will be described in conjunction with FIGS. 11 to 16. In the method according to the second embodiment, the process up to the state shown in FIG. 4 is the same as that of the first embodiment. Then, as shown in FIG. 11, using a tube type reduced pressure CVD apparatus, an amorphous silicon film 18 as thick as 500 Å to be a storage electrode without an impurity is formed using a tube type reduced pressure CVD apparatus as shown in FIG. 11 along the shape of the side and bottom surfaces 8a and 8c of the first hole and the upper surface 8b of interlayer oxide film 8 at a temperature in the range from 515° C. to 535° C. and a deposition pressure of 0.4 Torr. Then, as shown in FIG. 12, amorphous silicon film 18 without an impurity is heat-treated for 5 minutes at a temperature of 700° C. to form irregularities on the surface, and an amorphous silicon film 19 with irregularities is formed.

Figure 14:
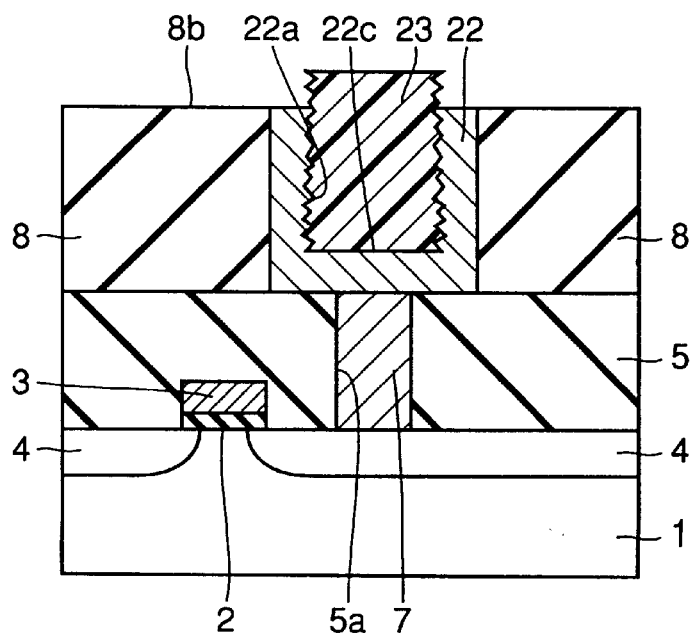
FIG. 14 is a cross sectional view showing a state immediately after a resist film is formed to fill a hole formed by a storage electrode in the method according to the second embodiment.

Then, ions are implanted as denoted by arrow 20 at incidence angle of 0° onto the upper surface of amorphous silicon film 19 having irregularities formed on the upper surface 8b of interlayer oxide film 8 in a dose of $8 \times 10^{15}$ atom/cm$^2$, with an implantation energy of 20 keV to form an amorphous silicon film 21 having an upper surface 2 1a flattened. At this time, amorphous silicon film 21 is implanted with ions to have conductivity. Then, a resist film 23 is filled to cover the side and bottom surfaces 21a and 21c of a second hole, followed by removal of only the flattened amorphous silicon film 21 formed on the upper surface 8b of interlayer oxide film 8 by dry etching and a storage electrode 22 having the side and bottom surfaces 22a and 22c of the second hole is formed as shown in FIG. 14.

Figure 15:
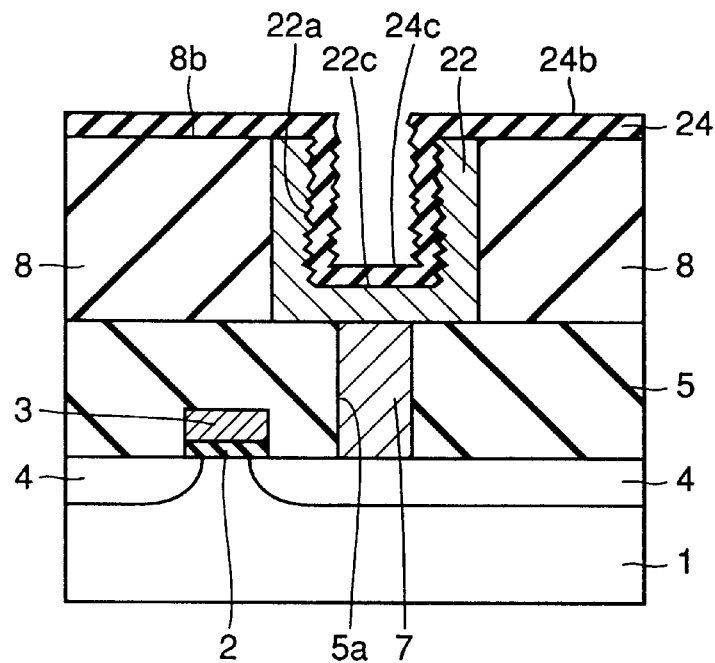
FIG. 15 is a cross sectional view showing a state immediately after a capacitor dielectric film is formed to cover the storage electrode in the method according to the second embodiment.
Figure 16:
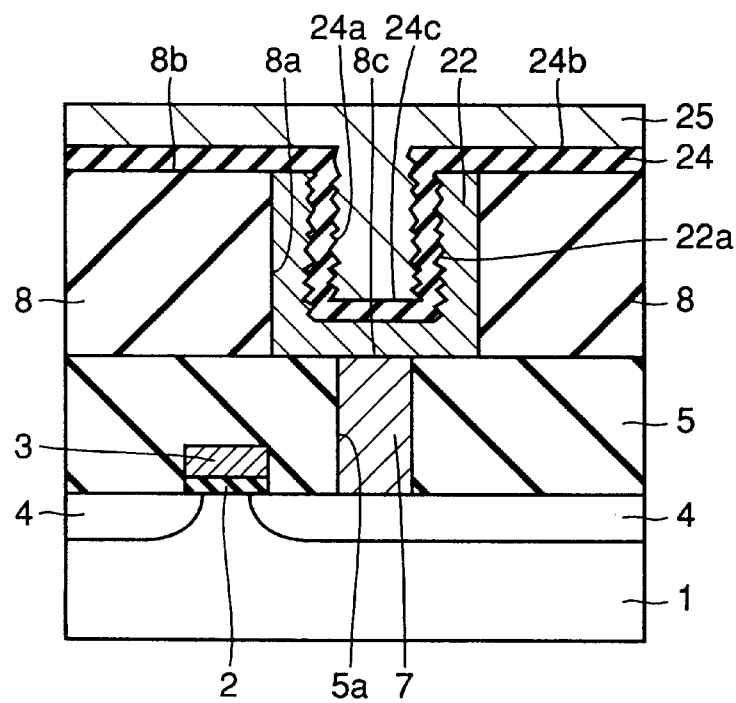
FIG. 16 is a cross sectional view showing a state immediately after a cell plate electrode is formed to cover the capacitor dielectric film in the method according to the second embodiment.
Figure 17:
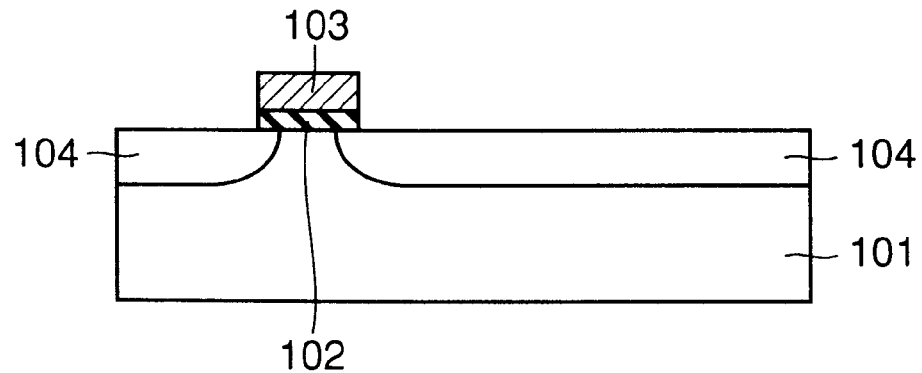
FIG. 17 is a cross sectional view showing a state immediately after source/drain regions are formed on both sides of a gate electrode in a conventional method of manufacturing a semiconductor device.
Figure 18:
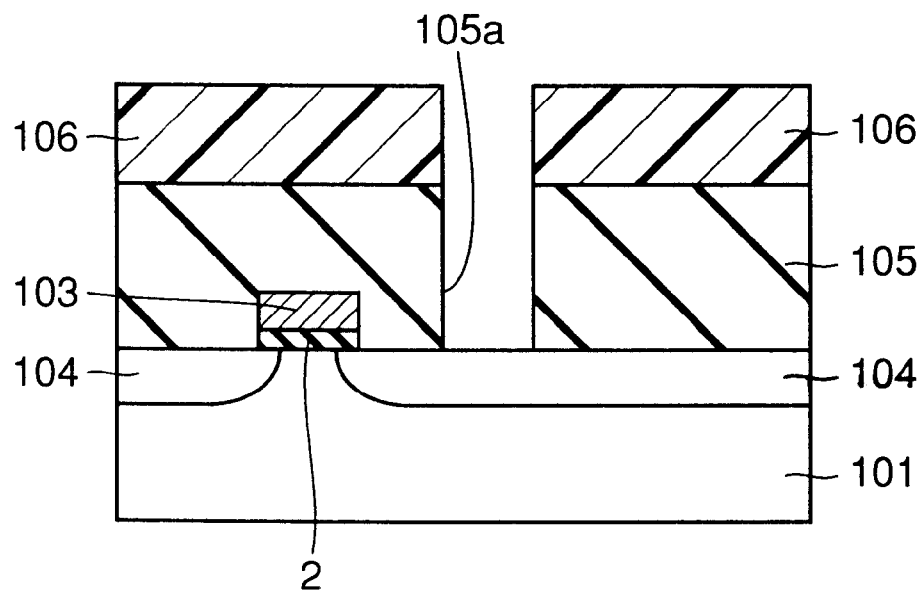
FIG. 18 is a cross sectional view showing a state immediately after a contact hole penetrating through an interlayer oxide film which covers the gate electrode and connecting with a source/drain region in the conventional method.
Figure 19:
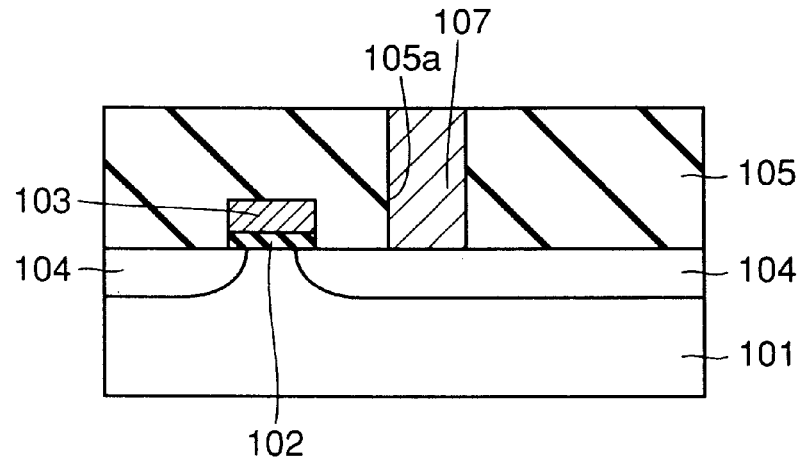
FIG. 19 is a cross sectional view showing a state immediately after a contact plug fills a contact hole connecting with the source/drain region in the conventional method.
Figure 20:
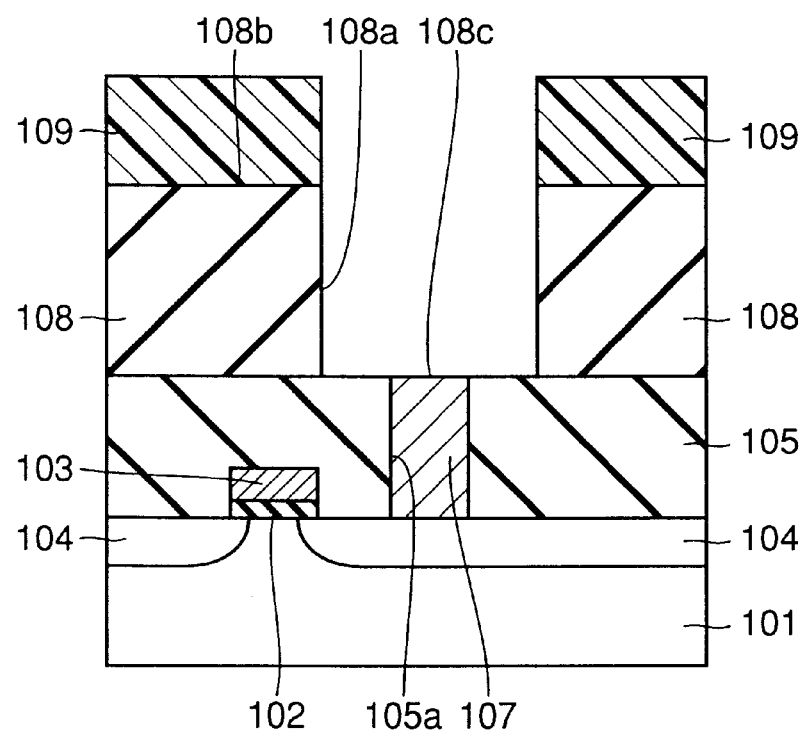
FIG. 20 is a cross sectional view showing a state immediately after a hole is formed in an upper interlayer oxide film in the conventional method.
Figure 21:
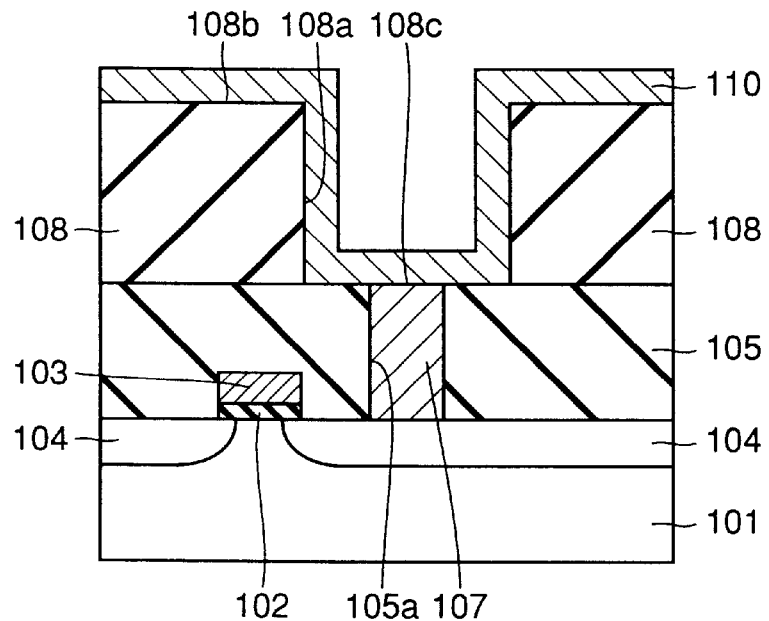
FIG. 21 is a cross sectional view showing a state immediately after an amorphous silicon film containing an impurity to be a storage electrode is formed to cover a surface of the upper interlayer oxide film and bottom and side surfaces of a hole in the conventional method.
Figure 22:
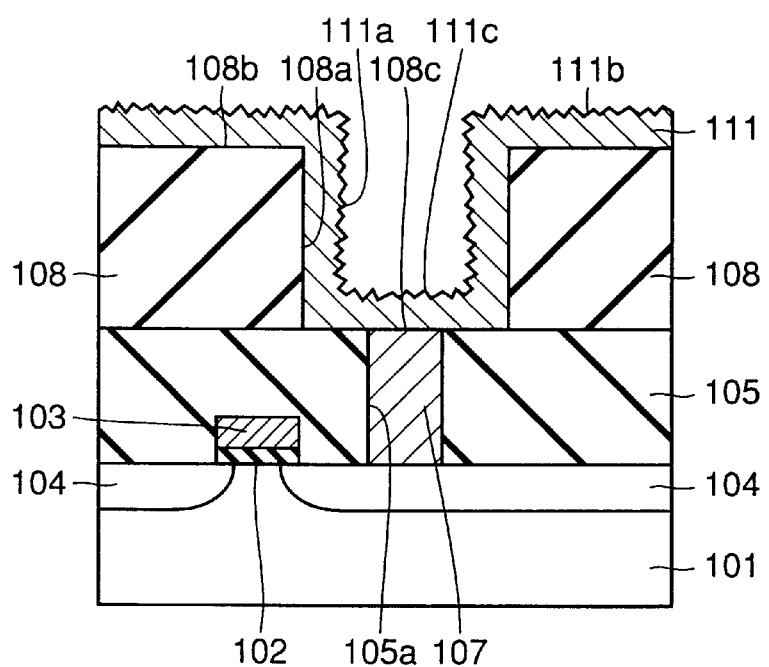
FIG. 22 is a cross sectional view showing a state immediately after irregularities are formed by heat treatment on the surface of the amorphous silicon film containing an impurity to be a storage electrode in the conventional method.
Figure 23:
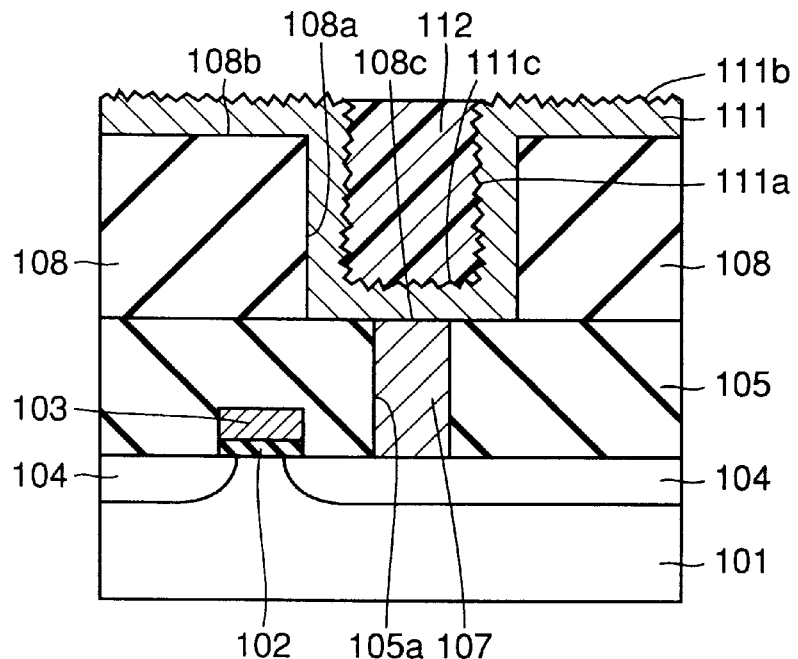
FIG. 23 is a cross sectional view showing a state immediately after a resist film fills a hole formed by the amorphous silicon film having irregularities on its surface and containing an impurity to be a storage electrode in the conventional method.
Figure 24:
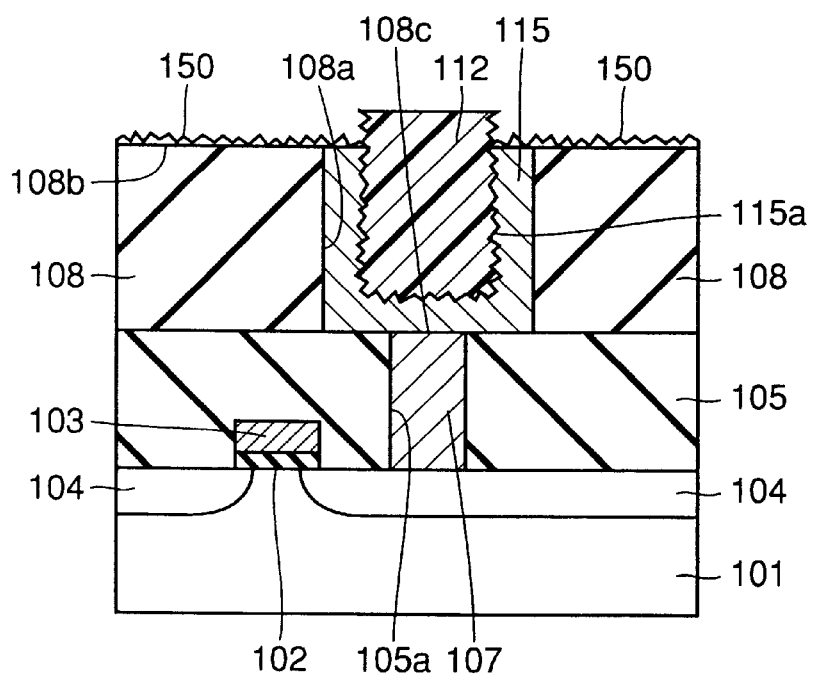
FIG. 24 is a cross sectional view showing a state immediately after etching residue is formed on the upper surface of the upper interlayer oxide film in the conventional method.
Figure 25:
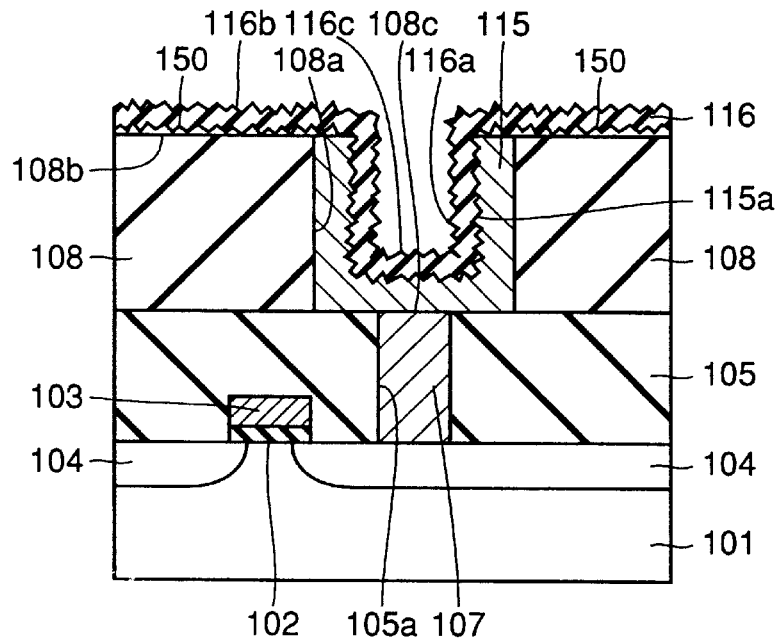
FIG. 25 is a cross sectional view showing a state immediately after a capacitor dielectric film to cover the storage electrode is formed in the conventional method.
Figure 26:
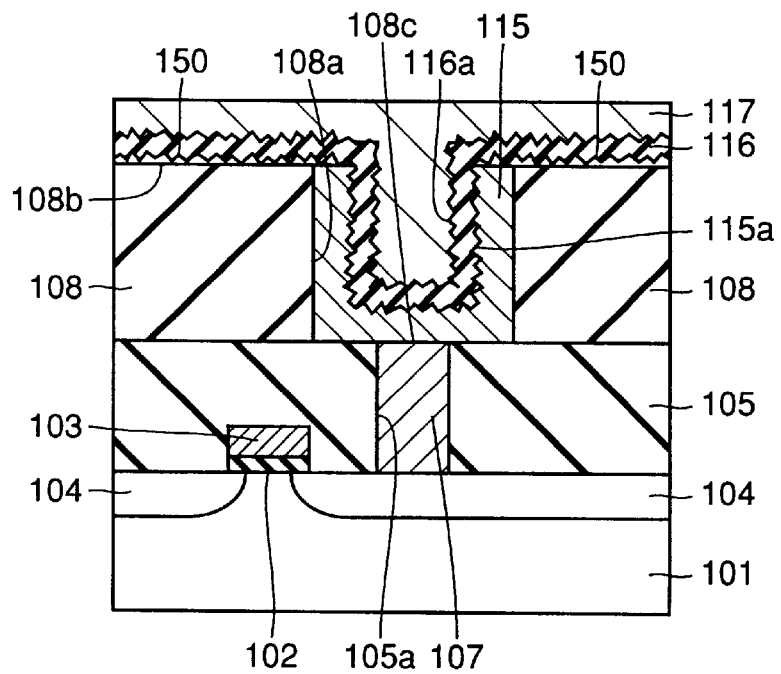
FIG. 26 is a cross sectional view showing a state immediately after a cell plate electrode is formed to cover the capacitor dielectric film in the conventional method.

Then, resist film 23 is removed to form a capacitor dielectric film 24 to cover the surface of storage electrode 22 and the upper surface 8b of interlayer oxide film 8 as shown in FIG. 15. Then as shown in FIG. 16, a cell plate electrode 25 is formed to cover the side and bottom surfaces 24a and 24c of the third hole formed by capacitor dielectric film 24 and the upper surface 24b of the capacitor dielectric film.

Figure 13:
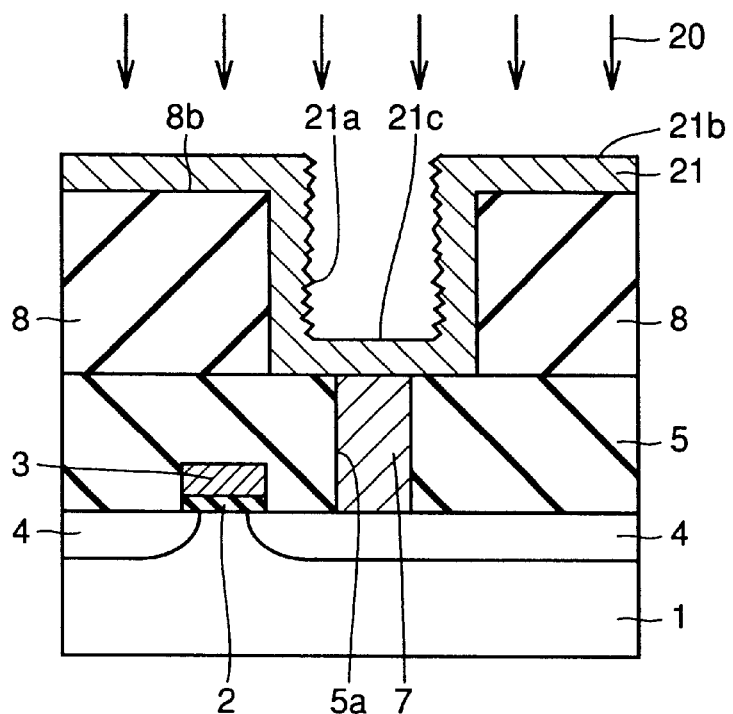
FIG. 13 a cross sectional view showing a state immediately after the upper surface of the amorphous silicon film to be a storage electrode formed on the upper surface of the interlayer oxide film is flattened by ion-implantation in the method according to the second embodiment.

Since this manufacturing method includes the step of implanting ions as shown in FIG. 13 as denoted by arrow 20 onto amorphous silicon film 19 having irregularities, the ions eliminate the raised portion of the irregularities and fill the recessed portion formed on the upper surface of amorphous silicon film 19. As a result, the upper surface 21b of flattened amorphous silicon film 21 can be formed approximately parallel to the upper surface 8b of interlayer insulating film 8, so that when flattened amorphous silicon film 21 formed on the upper surface of 8b of interlayer insulating film 8 is etched back and removed, the upper surface 21b of amorphous silicon film 21 on the upper surface 8b of interlayer oxide film 8 can be etched back approximately parallel to the upper surface 8b of interlayer insulating film 8.

Thus, the irregularities formed on the upper surface of amorphous silicon film 19 can be etched back and will not be left as etching residue on the upper surface 8b of interlayer oxide film 8. As a result, the adverse effect on layers to be formed in the succeeding steps can be restrained. Short circuit between another conductive layer and the capacitor by the etching residue of the conductive amorphous silicon film can be prevented. As a result, if amorphous silicon film 19 having irregularities on the surface is formed in order to increase the area of the storage electrode 22 of a capacitor, the yield of semiconductor devices having the capacitor can be improved.

In the step of implanting ions as denoted by arrow 20, ions are implanted vertically to the upper surface 8b of interlayer oxide film 8, so that the surface irregularities of amorphous silicon film 19 approximately parallel to the side surface 8a of the first hole formed approximately vertically to the upper surface 8b of interlayer oxide film 8 are less likely to be flattened by the ion implantation as denoted by arrow 20, and therefore the capacity of the capacitor can be increased.

In the step of implanting ions as denoted by arrow 20, if the dose is not less than $8\times10^{15}$ atom/cm$^2$, the implantation energy is in the range from 10 keV to 10 keV, the irregularities can be flattened to such an extent that the succeeding steps will not be adversely affected. More specifically, the surface irregularities can be surely flattened and ions can be prevented from penetrating through amorphous silicon film 19.

In the step of implanting ions as denoted by-arrow 20, silicon is used as the ion species, amorphous silicon film 19 is less adversely affected. Furthermore, in the step of implanting ions as denoted by arrow 20, if the ion species is n-type, phosphorus or arsenic in the application of the present invention, the conductivity of an N-type channel MOS transistor will be less adversely affected.

Amorphous silicon film 19 having irregularities does not contain an impurity and therefore does not have conductivity, but if this film is electrified and has its irregularities flattened in the ion implantation as denoted by arrow 20 at the same time, the number of steps can be reduced.

Since storage electrode 22 is formed by an amorphous silicon film which is not yet crystallized, silicon atoms used to grow silicon crystal in the vicinity of the surface of amorphous silicon film 18 without an impurity are supplied from amorphous silicon film 18 in the step of forming irregularities on the surface of amorphous silicon film 18. As a result, in the step of forming a thin silicon film on the surface of amorphous silicon film 18 without an impurity and heat-treating the film to allow silicon crystal to grow and form irregularities on the surface of amorphous silicon film 18, larger irregularities can be formed on the surface. As a result, the surface area of storage electrode 22 is increased, so that the capacity of the capacitor can be improved.

Note that in the above first and second embodiments, amorphous silicon is used for a storage electrode having irregularities, but the same effect can be brought about using other semiconductor layers including a polycrystalline silicon layer, except that silicon atoms for growing crystal are supplied from the amorphous silicon film in the above embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the sequential steps of:

forming an interlayer insulating film on a semiconductor substrate;

forming a first hole penetrating through said interlayer insulating film;

forming a first layer including a semiconductor layer of a prescribed thickness so as to provide a second hole on side and bottom surfaces of said first hole and an upper surface of said interlayer insulating film;

forming irregularities on a surface of said first layer;

implanting silicon ions to an upper surface of said first layer formed at least on the upper surface of said interlayer insulating film;

removing only said first layer formed on the upper surface of said interlayer insulating film and forming a first conductive layer;

forming a dielectric film of a prescribed thickness to provide a third hole on the side and bottom surfaces of said second hole so as to cover at least a surface of said first conductive layer; and forming a second conductive layer to cover at least a surface of said dielectric film.

2. The method according to claim 1, wherein in said step of implanting ions, the ions are implanted vertically to the upper surface of said interlayer insulating film.

3. The method according to claim 1, wherein in said step of implanting ions, the dose of ions is at least $8\times10^{15}$ atom/cm$^2$, and the ion implantation energy is in the range from 10 keV to 100 keV.

4. The method according to claim 1, wherein said first layer is formed by an amorphous silicon layer.

5. The method according to claim 1, wherein the step of implanting ions into the upper surface of said first layer flattens the irregularities formed thereon.

\* \* \* \* \*